United States Patent
Kang et al.

(10) Patent No.: US 8,778,598 B2
(45) Date of Patent: *Jul. 15, 2014

(54) METHOD OF FORMING FINE PATTERNS OF SEMICONDUCTOR DEVICE BY USING DOUBLE PATTERNING PROCESS WHICH USES ACID DIFFUSION

(71) Applicant: Samsung Electronics Co., Ltd., Gyeonggi-do (KR)

(72) Inventors: Yool Kang, Gyeonggi-do (KR); Suk-joo Lee, Gyeonggi-do (KR); Jung-hyeon Lee, Gyeonggi-do (KR); Shi-yong Yi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/711,999

(22) Filed: Dec. 12, 2012

(65) Prior Publication Data

US 2014/0004705 A1  Jan. 2, 2014

Related U.S. Application Data

(62) Division of application No. 12/267,687, filed on Nov. 10, 2008, now Pat. No. 8,431,331.

(30) Foreign Application Priority Data

May 2, 2008 (KR) .................... 10-2008-0041483

(51) Int. Cl.
G03F 7/40 (2006.01)
(52) U.S. Cl.
USPC ............ 430/313; 430/314; 430/317; 430/330
(58) Field of Classification Search
USPC .................................. 430/313, 314, 317, 330
See application file for complete search history.

(56) References Cited

U.S. PATENT DOCUMENTS

| | | | |
|---|---|---|---|
| 6,534,243 B1 | 3/2003 | Templeton et al. | |
| 8,173,358 B2 * | 5/2012 | Kim et al. | 430/312 |
| 8,431,331 B2 * | 4/2013 | Kang et al. | 430/313 |
| 2006/0187403 A1 | 8/2006 | Yao et al. | |
| 2007/0077524 A1 | 4/2007 | Koh et al. | |

FOREIGN PATENT DOCUMENTS

| | | |
|---|---|---|
| CN | 1227355 A | 9/1999 |
| CN | 1821871 A | 8/2006 |
| CN | 101042531 A | 9/2007 |
| CN | 101145514 A | 3/2008 |
| JP | 2007-227934 | 9/2007 |
| KR | 1020070004234 A | 1/2007 |
| KR | 1020070037098 A | 4/2007 |
| KR | 1020080024054 A | 3/2008 |

OTHER PUBLICATIONS

Chinese Office Action corresponding to Chinese Application No. 200910134899.5 issued Sep. 17, 2012.
First Japanese Office Action corresponding to Japanese Application No. 2009-107527 issued Feb. 18, 2013.

* cited by examiner

*Primary Examiner* — Daborah Chacko Davis
(74) *Attorney, Agent, or Firm* — Myers Bigel Sibley & Sajovec, P.A.

(57) ABSTRACT

A method of forming fine patterns of a semiconductor device according to a double patterning process that uses acid diffusion is provided. In this method, a plurality of first mask patterns are formed on a substrate. A capping film including an acid source is formed on the exposed surface areas of the plurality of first mask patterns. A second mask layer is formed on the capping films. A plurality of acid diffused regions are formed within the second mask layer by diffusing acid obtained from the acid source from the capping films into the second mask layer. A plurality of second mask patterns are formed of residual parts of the second mask layer which remain after removing the acid diffused regions of the second mask layer.

10 Claims, 6 Drawing Sheets

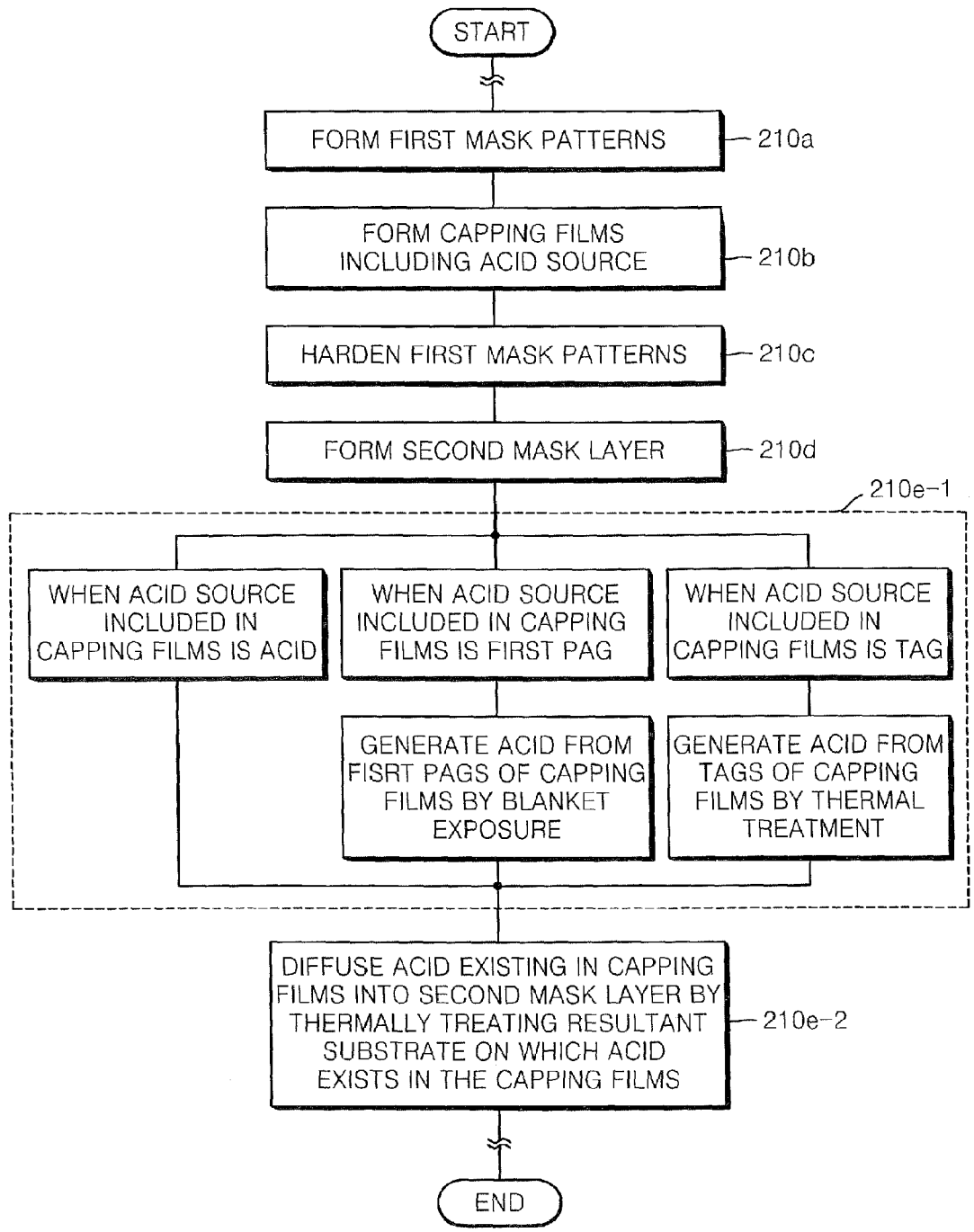

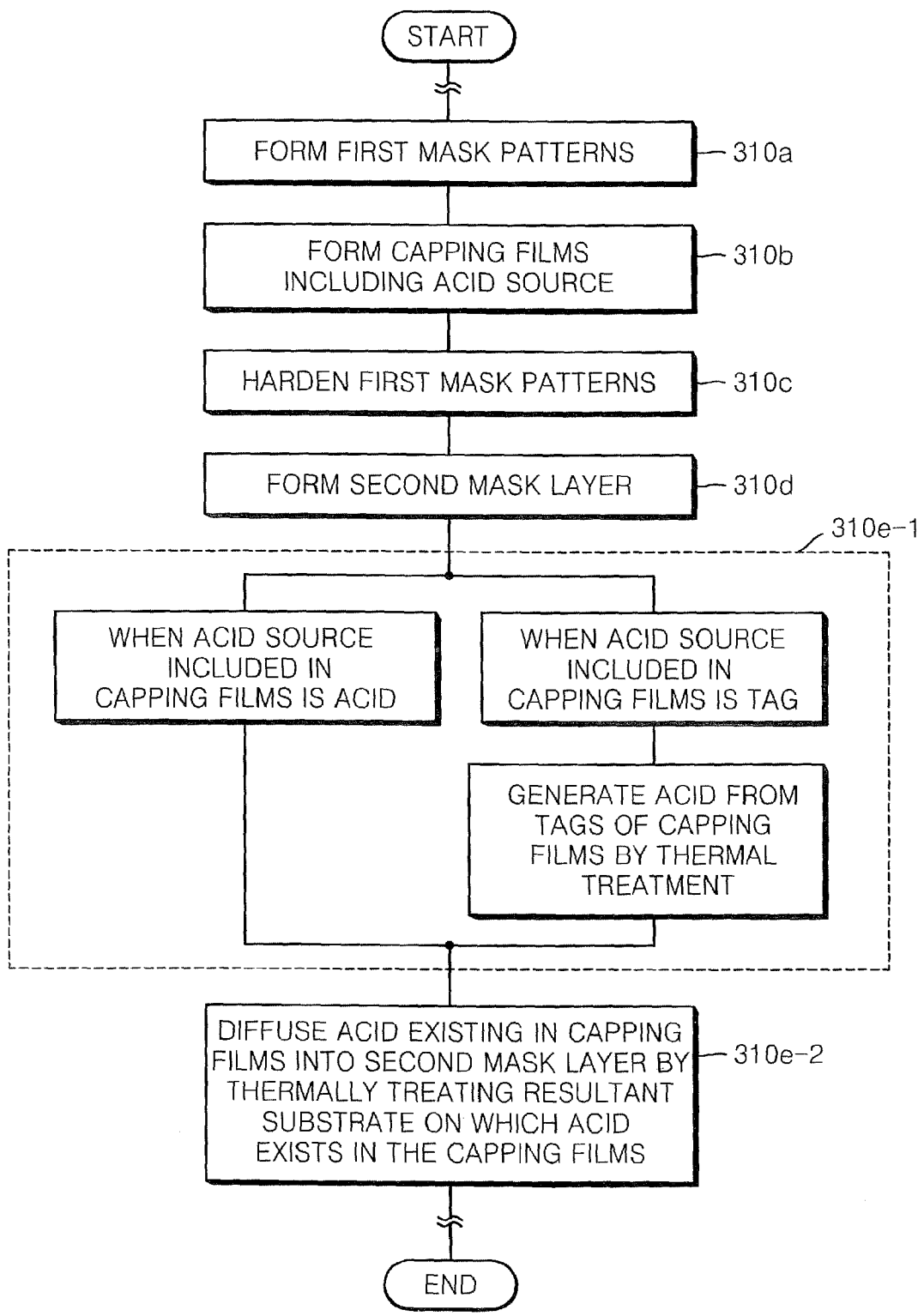

METHOD OF FORMING FINE PATTERNS OF SEMICONDUCTOR DEVICE BY USING DOUBLE PATTERNING PROCESS WHICH USES ACID DIFFUSION

CROSS-REFERENCE TO RELATED PATENT APPLICATIONS

This application is a divisional application of U.S. application Ser. No. 12/267,687, now allowed, filed on Nov. 10, 2008, which claims priority to Korean Patent Application No. 10-2008-0041483, filed on May 2, 2008, in the Korean Intellectual Property Office, the disclosures of which are incorporated herein in their entireties by reference.

BACKGROUND

The present invention relates to a method of forming fine patterns of a semiconductor device, and more particularly, to a method of forming fine patterns of a semiconductor device, by which fine patterns are repeatedly formed at intervals of a fine pitch by using a double patterning process, thereby overcoming a resolution limit of existing exposure equipment.

Forming fine patterns is essential in manufacturing highly-integrated semiconductor devices. In order to integrate many elements within a small area, the size of the individual elements needs to be minimized. In order to form small elements, a pitch corresponding to a sum of the width of each pattern to be formed and an interval between adjacent patterns should be designed to be small. With the recent rapid reduction in design rules of semiconductor devices, there is a limit in forming desired fine-pitch patterns due to a resolution limit in photolithography for forming patterns required to manufacture semiconductor devices. In particular, in a photolithographic process for forming line and space patterns on a substrate, there is a limit in forming desired fine-pitch patterns due to a resolution limit.

In order to overcome the resolution limits in such photolithographic processes, some methods of forming fine hard mask patterns having fine pitches by using a double patterning process have been proposed. However, according to these methods of forming fine mask patterns by using the double patterning process, a material used to form the fine mask patterns needs to be deposited within an aperture having a high aspect ratio according to a deposition process such as chemical vapor deposition (CVD). Therefore, there is a limit in forming a film having good burying characteristics, namely, having no defects such as voids, within the aperture.

SUMMARY

The present invention provides a method of forming fine patterns of a semiconductor device using a double patterning process, by which etch mask patterns are formed with a doubled density within a predetermined area by using a chemical reaction without using expensive deposition equipment.

According to an aspect of the present invention, there is provided a method of forming fine patterns of a semiconductor device. In this method, a plurality of first mask patterns are formed on a substrate so that the plurality of first mask patterns may be equally separated from one another respectively by a first space, in a direction parallel to a main surface of the substrate. A capping film comprising an acid source may be formed on side walls and an upper surface of each of the plurality of first mask patterns. A second mask layer may be formed on the capping films so as to fill the first spaces. A plurality of acid diffused regions extending from the capping films into the second mask layer may be formed by diffusing acid obtained from the acid source from the capping films into the second mask layer. A plurality of second mask patterns corresponding to residual parts of the second mask layer which remain in the first spaces after removing the acid diffused regions of the second mask layer may be formed.

Each of the capping films may further include water-soluble polymer. The acid source may include a water-soluble acid or potential acid.

The acid source may include a first photoacid generator that includes a chromophore group and generates acid when being exposed to a laser, for example, a KrF excimer laser (248 nm), an ArF excimer laser (193 nm), or an $F_2$ excimer laser (157 nm). The acid source may include a thermoacid generator.

The second mask layer may include neither acid nor potential acid, i.e., the second mask layer may be devoid of an acid or potential acid. The second mask layer may include an inactive acid source different than the acid source included in the capping film. The inactive acid source may include a second photoacid generator that includes no chromophore groups, generates no acid when being exposed to a KrF excimer laser (248 nm), an ArF excimer laser (193 nm), or an $F_2$ excimer laser (157 nm), and generates acid when being exposed to extreme ultraviolet (EUV) light (1 to 31 nm). Alternatively, the inactive acid source may include a first photoacid generator that includes a chromophore group and generates acid when being exposed to a laser, for example, a KrF excimer laser (248 nm), an ArF excimer laser (193 nm), or an $F_2$ excimer laser (157 nm).

The second mask layer may include a photoresist film which includes a polymer having an acid-labile group and includes neither acid nor potential acid.

In the forming of the acid diffused regions, a resultant substrate on which the second mask layer has been formed may be thermally treated so as to diffuse the acid obtained from the acid source from the capping films into the second mask layer.

When the acid source includes a first photoacid generator comprising a chromophore group, the forming of the acid diffused regions may include generating a first acid from the acid source contained in the capping films by exposing the resultant substrate on which the second mask layer has been formed on the capping films, and diffusing the first acid from the capping films into the second mask layer by thermally treating a resultant substrate on which the first acid has been generated. When the acid source includes a thermoacid generator, the forming of the acid diffused regions may include generating a second acid from the acid source contained in the capping films by thermally treating the resultant substrate on which the second mask layer has been formed on the capping films, and diffusing the second acid from the capping films into the second mask layer.

The acid diffused regions may be developed using a basic aqueous solution in order to be removed from the second mask layer.

When the plurality of first mask patterns includes a photoresist film, the method may further include the operation of hardening the plurality of first mask patterns so that the plurality of first mask patterns have insolubility with respect to an organic solvent. Such operation occurs between the forming of the plurality of first mask patterns and the forming of the second mask layer. The hardening of the plurality of first mask patterns may be performed before or after the capping films are formed.

The method may further include etching the substrate by using the plurality of first mask patterns and the plurality of second mask patterns as an etch mask.

According to another aspect of the present invention, there is provided a method of forming fine patterns of a semiconductor device. In this method, a plurality of first mask patterns are formed on a substrate. A capping film including an acid source including acid, a first photoacid generator having a chromophore group, or a thermoacid generator may be formed on exposed surface areas of each of the plurality of first mask patterns. A second mask layer may be formed on the capping films, wherein the second mask layer includes polymer having an acid-labile group and a second photoacid generator not having a chromophore group. A plurality of acid diffused regions within the second mask layer may be formed by diffusing acid obtained from the acid source from the capping films into the second mask layer. A plurality of second mask patterns corresponding to residual parts of the second mask layer which remain after removing the acid diffused regions of the second mask layer may be formed.

According to another aspect of the present invention, there is provided a method of forming fine patterns of a semiconductor device. In this method, a plurality of first mask patterns are formed on a substrate. A capping film may be formed on exposed surface areas of each of the plurality of first mask patterns, wherein the capping film includes an acid source including acid, a first photoacid generator having a chromophore group, or a thermoacid generator. A second mask layer may be formed on the capping films, wherein the second mask layer includes polymer having an acid-labile group and includes neither acid nor potential acid. A plurality of acid diffused regions may be formed within the second mask layer by diffusing acid obtained from the acid source from the capping films into the second mask layer. A plurality of second mask patterns corresponding to residual parts of the second mask layer which remain after removing the acid diffused regions of the second mask layer may be formed.

According to another aspect of the present invention, there is provided a method of forming fine patterns of a semiconductor device. In this method, a plurality of first mask patterns are formed on a substrate. A capping film may be formed on exposed surface areas of each of the plurality of first mask patterns, wherein the capping film includes an acid source including one of acid and a thermoacid generator. A second mask layer may be formed on the capping films, wherein the second mask layer includes a polymer having an acid-labile group and a first photoacid generator having a chromophore group. A plurality of acid diffused regions may be formed within the second mask layer by diffusing acid obtained from the acid source from the capping films into the second mask layer. A plurality of second mask patterns corresponding to residual parts of the second mask layer which remain after removing the acid diffused regions of the second mask layer may be formed.

BRIEF DESCRIPTION OF THE DRAWINGS

FIG. 2 is a flowchart illustrating operations that can be implemented in some specific cases, in the fine pattern forming method illustrated in FIGS. 1A through 1G, according to an embodiment of the present invention; and FIG. 3 is a flowchart illustrating operations that can be implemented in other specific cases, in the fine pattern forming method illustrated in FIGS. 1A through 1G, according to an embodiment of the present invention.

DETAILED DESCRIPTION OF THE EMBODIMENTS

Figure 1A:
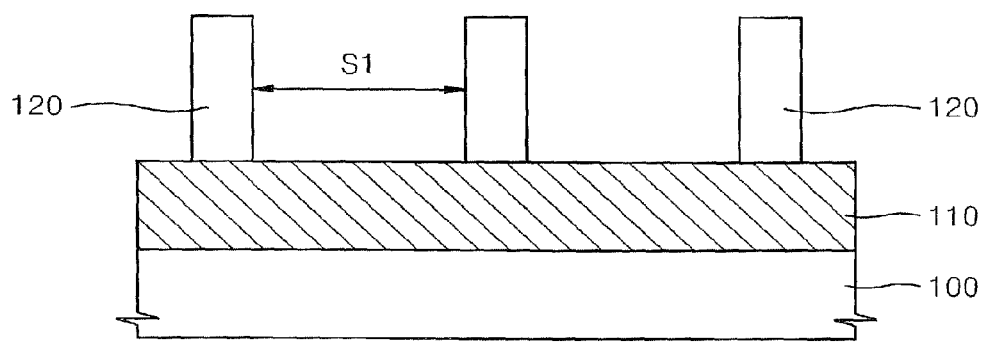
FIGS. 1A through 1G are cross-sectional views illustrating a method of forming fine patterns of a semiconductor device, according to an exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

FIGS. 1A through 1G are cross-sectional views illustrating a method of forming fine patterns of a semiconductor device, according to an exemplary embodiment of the present invention.

Referring to FIG. 1A, a to-be-etched film 110 is formed on a substrate 100, and a plurality of first mask patterns 120 are formed on the to-be-etched film 110. The first mask patterns 120 are equally separated from one another respectively by a first space S1 in a direction substantially parallel to a main surface of the substrate 100.

The substrate 100 may be a silicon substrate.

The to-be-etched film 110 may be formed of any material according to the purposes of patterns that are to be formed on the to-be-etched film 110. If a gate electrode is formed on the substrate 100, the to-be-etched film 110 may be a conductive layer, for example, a doped polysilicon layer, or a stacked structure including the doped polysilicon layer and a metal silicide layer. If bit lines are formed on the substrate 100, the to-be-etched film 110 may be formed of a metal, for example, tungsten or aluminum. If fine patterns to be finally formed are formed by etching the substrate 100, the to-be-etched film 110 may not be formed. For example, if active regions are defined in the substrate 100 by using a method according to the present invention, the to-be-etched film 110 may be omitted. In some cases, before the first mask patterns 120 are formed on the to-be-etched film 110, an antireflective film (not shown) may be further formed on the to-be-etched film 110.

The first mask patterns 120 may be resist patterns formed of a typical resist composition. In order to form the first mask patterns 120, for example, a resist film may be formed by coating an upper surface of the to-be-etched film 110 with a photoresist material, and then the resist film may undergo exposure and development according to a typical photolithographic process so as to form resist patterns having apertures. The apertures may expose portions of the upper surface of the to-be-etched film 110; the portions having predetermined widths.

For example, the first mask patterns 120 may be formed of a chemical amplification positive resist composition that includes a photoacid generator (PAG). In this regard, the first mask patterns 120 may be formed of a resist composition for a KrF excimer laser (248 nm), a resist composition for a ArF excimer laser (193 nm), or a resist composition for an $F_2$ excimer laser (157 nm). Alternatively, the first mask patterns 120 may be formed of a negative resist composition. When the first mask patterns 120 are formed of a negative resist composition, the first mask patterns 120 may be formed of a combination of a thermoacid generator (TAG), in which acid decomposition of the TAG occurs at a temperature higher than a process temperature used until the first mask patterns 120 are formed, with the negative resist composition. Reasons for and effects of the formation of the first mask patterns 120 by using the mixture of the TAG and the negative resist composition will be described later with reference to FIG. 1E.

Figure 1B:
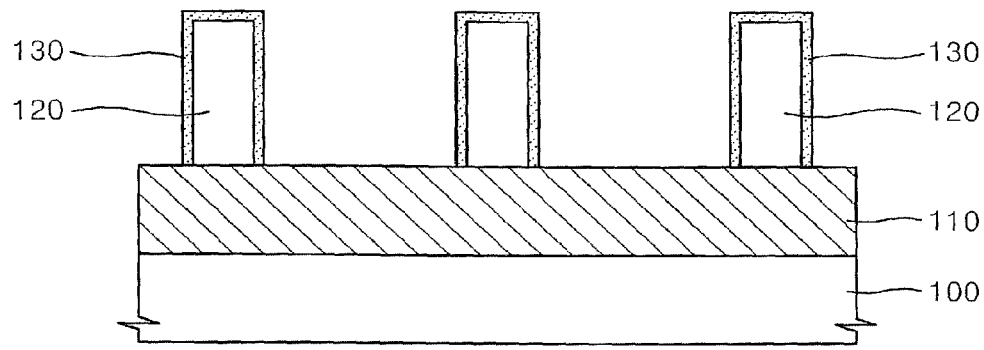

Referring to FIG. 1B, a capping film 130 is formed on sidewalls and an upper surface of each of the first mask patterns 120.

Each of the capping films 130 includes an acid source comprising acid or potential acid. For example, each of the capping films 130 may be formed of a mixture of a polymer and an acid source.

The potential acid included in the capping films 130 may be, for example, perfluorobutane sulfonic acid ($C_4F_9SO_3H$), trifluoroacetic acid ($CF_3CO_2H$), or trifluoromethanesulfonic acid ($CF_3SO_3H$).

Alternatively, the potential acid included in the capping films 130 may be a first PAG which includes a chromophore group and generates acid when being exposed to laser, such as a KrF excimer laser (248 nm), an ArF excimer laser (193 nm), or a $F_2$ excimer laser (157 nm). In this case, the first PAG may be formed of triarylsulfonium salts, diaryliodonium salts, sulfonates, or a mixture of two or more of these materials. For example, the first PAG may be triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, or norbornene-dicarboximide PFOS, or a mixture of two or more of these compounds.

Alternatively, the potential acid included in the capping films 130 may be a TAG that generates acid by heat. The TAG may be formed of an aliphatic or alicyclic compound. For example, the TAG may be formed of at least one compound of carbonate ester, sulfonate ester, and phosphate ester. More specifically, the TAG may be formed of at least one compound of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, or adamantyl nonafluorobutanephosphonate or a mixture of two or more of these compounds.

When the capping films 130 are formed of a mixture of polymer and the acid source, the content of the acid source may be 0.01 to 50% by weight based on a gross weight of the polymer.

Polymer that may be included in the capping films 130 may be water-soluble polymer. For example, the water-soluble polymer may include at least one of an acrylamide type monomer unit, a vinyl type monomer unit, an akylenglicol type monomer unit, a maleic anhydride monomer unit, an ethylenimine monomer unit, a monomer unit comprising an oxazoline group, an acrylonitrile monomer unit, an allylamide monomer unit, a 3,4-dihydropyran monomer unit, and a 2,3-dihydrofuran monomer unit, as a repeating unit.

A method of forming the capping films 130 may comprise a process of coating exposed surfaces of the first mask patterns 120 with a capping composition composed of a mixture of water, water-soluble polymer, and an acid source composed of water-soluble acid or potential acid and then thermally treating the resultant coated first mask patterns 120.

Another method of forming the capping films 130 may comprise a process of mixing a Resolution Enhancement Lithography Assisted by Chemical Shrink (RELACS™) material (manufactured by AZ Electronic Materials) with one of the aforementioned acid sources, spin-coating the mixture on exposed surfaces of the first mask patterns 120, and baking the resultant first mask patterns 120 for a predetermined period of time at a predetermined temperature, for example, for about 20 to 70 seconds at about 100 to 130° C., so as to form the capping films 130. At this time, acid remaining on the surfaces of the first mask patterns 120 may serve as a catalyst, and thus the RELACS™ material may be cross-linked with the surfaces of the first mask patterns 120, thereby forming the capping films 130. After the capping films 130 are formed, an unnecessary coating composite remaining on the capping films 130 may be removed by water, an organic solvent, a mixture of water and an organic solvent, or a developing solution.

Figure 1C:
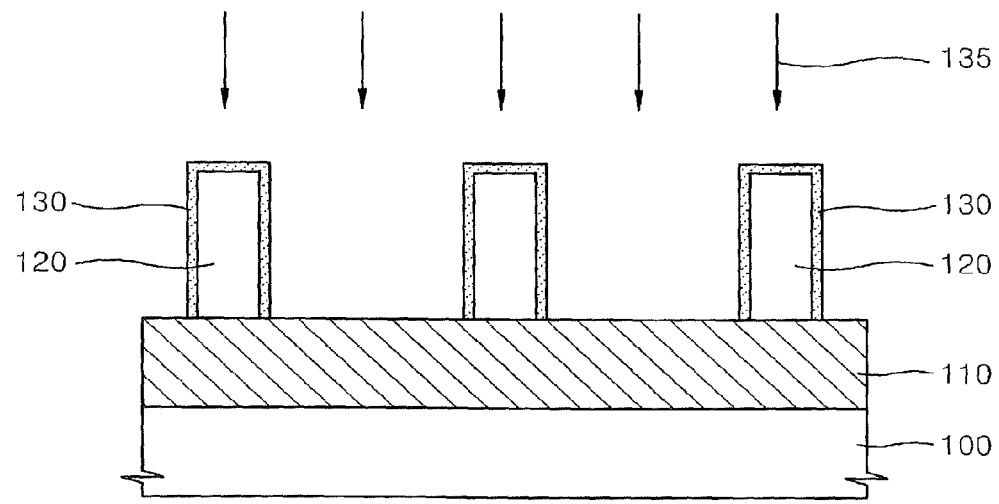

Referring to FIG. 1C, the first mask patterns 120 are hardened so as to have insolubility with respect to an organic solvent, for example, propylene glycol methyl ether acetate (PGMEA), ethyl lactate (EL), cyclohexanone, etc.

The first mask patterns 120 may be hardened by a plasma treatment 135. Plasma in the plasma treatment 135 may be, for example, Ar plasma or HBr plasma.

Although the plasma treatment 135 is performed after the formation of the capping films 130 in the present embodiment, the inventive concept is not limited thereto. That is, the plasma treatment 135 may be performed between the formation of the first mask patterns 120 and the formation of the capping films 130. When the capping films 130 contain the first PAG or acid, the solubility of the first mask patterns 120 with respect to an organic solvent may be changed even by only performing a baking process after the coating of the first mask patterns 120 with a coating composition in order to form the capping films 130. Thus, in a subsequent process (for example, a process of forming the second mask layer 140, described below with reference to FIG. 4D), the first mask patterns 120 may become insoluble with respect to an organic solvent used when the capping films 130 are coated with another resist material, and thus dissolution of the first mask patterns 120 may be prevented.

Figure 1D:
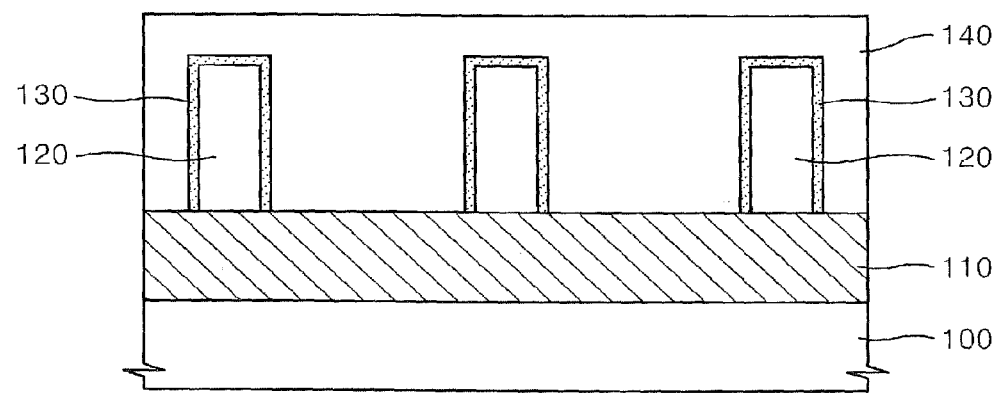

Referring to FIG. 1D, a second mask layer 140 is formed on the capping films 130 and the to-be-etched film 110 so as to fill the first spaces S1 between the first mask patterns 120.

The second mask layer 140 may be a photoresist film. The photoresist film that forms the second mask layer 140 may be a photoresist film that includes neither an acid nor a potential acid and includes a polymer having an acid-labile group.

Alternatively, the second mask layer 140 may include an inactive acid source different from the aforementioned acid source. The inactive acid source may be composed of potential acid. For example, the second mask layer 140 may be formed of a photoresist film that includes a polymer having an acid-labile group and the potential acid. In this case, the potential acid included in the second mask layer 140 may comprise a second PAG which has no chromophore groups, generates no acid when being exposed to one of a KrF excimer laser (248 nm), an ArF excimer laser (193 nm), and a F₂ excimer laser (157 nm), and generates acid when being exposed to an extreme ultraviolet (EUV) light (1 to 31 nm).

The second PAG may be composed of a material expressed in one of Formulas 1 and 2.

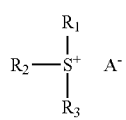

(1)

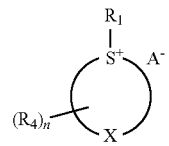

(2)

wherein:
R₁, R₂, and R₃ denote alkyl groups of $C_1$~$C_{10}$;
X denotes an alicyclic hydrocarbon group of $C_3$~$C_{20}$ which forms a ring together with $S^+$ of Formula 2, and at least one $CH_2$ in the alicyclic hydrocarbon group can be substituted with one of S, O, N, a ketone group, and $R_5$—$S^+A^-$ (where $R_5$ denotes an alkyl group of $C_1$~$C_{10}$;
R₄ denotes an alkyl group of $C_1$~$C_{20}$, a cycloalkyl group of $C_1$~$C_{20}$, an alicyclic hydrocarbon group of $C_1$~$C_{20}$, an aromatic hydrocarbon group of $C_1$~$C_{20}$, a hydroxyl group, a cyano group, a nitro group, or a halogen-family element;
n denotes 0 or 1;
R₂ and R₃ in Formula 1 may form rings in cooperation with $S^+$ of Formula 1 and thus can be combined with each other in the form of —R₂—R₃— so as to be expressed as Formula 2 when n=0; and
$A^-$ denotes a counter ion.

For example, the second PAG may be comprised of trim-ethylsulfonium triflate, methyl-tetrahydrothiophene triflate, methyl-pentahydrothiopyran triflate, methyl-tetrahydrothi-opyran-4-one triflate, or methyl-dithiane triflate.

In some cases, the potential acid included in the second mask layer 140 may be composed of the first PAG, which includes a chromophore group and generates acid when being exposed to a laser such as a KrF excimer laser (248 nm), an ArF excimer laser (193 nm), or a F₂ excimer laser (157 nm). In this case, an exposure of the second mask layer 140 should not be performed until the second mask layer 140 is removed.

Although it is illustrated in FIG. 1D that the second mask layer 140 may be formed to have an upper surface higher than the upper surfaces of the capping films 130, the present invention is not limited to this formation. For example, the second mask layer 140 may be formed to have a height less than or equal to that of the upper surface of each of the capping films 130, by being partially solved using a developing solution or an organic solvent (for example, alcohol liquid).

Although not illustrated in FIG. 1D, after the formation of the second mask layer 140, an upper capping film (not shown) or an acid supply layer (not shown) comprising the same material as a material used to form the capping films 130 may be further formed on the upper surface of the second mask layer 140. A detailed description of this case will now be made with reference to FIG. 1E.

Figure 1E:
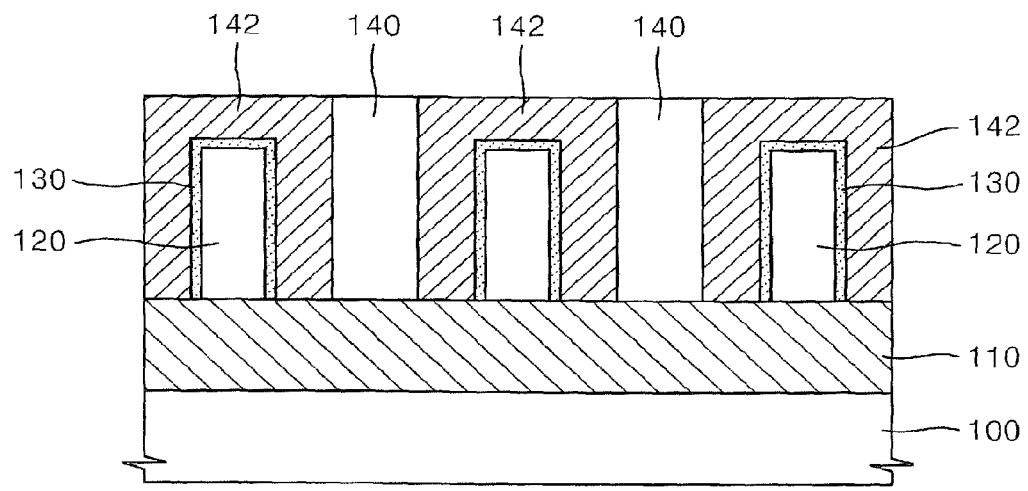

Referring to FIG. 1E, acid obtained from the acid source included in the capping films 130 is diffused into the second mask layer 140, thereby forming acid diffused regions 142 which extend from the capping films 130 into the second mask layer 140.

The acid diffused regions 142 may be formed by exposure or thermal treatment.

A case where the acid diffused regions 142 are formed by exposure corresponds to a case where the acid source included in the capping films 130 is the first PAG. The case where the acid diffused regions 142 are formed by exposure may be applied only when the second mask layer 140 comprises a photoresist film including polymer having an acid-labile group and includes neither acid nor potential acid or when the second mask layer 140 comprises a photoresist film including polymer having an acid-labile group and includes an inactive acid source, that is, the second PAG which has no chromophore groups and generates no acid when being exposed to a KrF excimer laser (248 nm), an ArF excimer laser (193 nm), or a $F_2$ excimer laser (157 nm).

When the acid diffused regions 142 are formed by exposure, a resultant substrate on which the second mask layer 140 has been formed may be exposed to a laser such as a KrF excimer laser (248 nm), an ArF excimer laser (193 nm), or an $F_2$ excimer laser (157 nm) so as to generate acid from the first PAG, and a resultant substrate on which acid has been generated from the capping films 130 is thermally treated so as to diffuse the acid existing within the capping films 130 into the second mask layer 140. The thermal treatment may be performed at a temperature of about 25 to 200° C. The time required for the thermal treatment may be variably controlled according to a desired distance by which acid is diffused.

A case where the acid diffused regions 142 are formed by thermal treatment corresponds to a case where the acid source included in the capping films 130 is acid or a TAG. In this case, since exposure is not performed when the second mask layer 140 has been formed on the substrate 100, the second mask layer 140 may be formed of a photoresist film including polymer having an acid-labile group, and the first PAG that includes a chromophore group and generates acid when being exposed to a KrF excimer laser (248 nm), an ArF excimer laser (193 nm), or a $F_2$ excimer laser (157 nm) may be included in the second mask layer 140. When the first PAG is included within the second mask layer 140, the second mask layer 140 is not exposed. Thus, the first PAG continuously maintains an inactive state in which acid is not generated. In addition, the second mask layer 140 may include neither acid nor potential acid, or include an inactive acid source which generates no acid when being exposed to a KrF excimer laser (248 nm), an ArF excimer laser (193 nm), or an $F_2$ excimer laser (157 nm), like the second PAG.

When the acid diffused regions 142 are formed by thermal treatment, a resultant substrate on which the second mask layer 140 has been formed may be thermally treated so as to consecutively 1) perform a process of generating acid from the TAGs included in the capping films 130 and 2) a process of diffusing the acid existing within the capping films 130 into the second mask layer 140.

In the formation of the first mask patterns 120 described above with reference to FIG. 1A, when the first mask patterns 120 are formed of a negative type resist composition which is mixed with a TAG in which acid decomposition occurs at a temperature higher than a process temperature used until the first mask patterns 120 are formed, a resultant substrate on which the second mask layer 140 has been formed may be thermally treated at a temperature equal to or greater than a temperature at which the TAG included in the first mask patterns 120 generates acid, and thus acid is generated from the TAG included in the first mask patterns 120. While the acid included in the capping films 130 is being diffused into the second mask layer 140, the acid included in the first mask patterns 120 may also be diffused into the second mask layer 140. The generation of acid from the TAG included in the first mask patterns 120 and the thermal treatment for the diffusion of the acid may be performed simultaneously with the generation of acid from the TAG included in the capping films 130 and the thermal treatment for the diffusion of the acid, respectively.

If an acid source composed of the second PAG not including a chromophore group, which is expressed as Formula 1 or 2, is included in the second mask layer 140, when the acid from the capping films 130 is diffused into the second mask layer 140, the second PAG adjacent to the acid diffused into the second mask layer 140 may act as acid without undergoing exposure. Accordingly, when the second PAG exists in the second mask layer 140, the size of the acid diffused regions 142 increases compared with when no second PAGs exist in the second mask layer 140. A detailed description of the increase of the size of the acid diffused regions 142 will now be made with reference to the following experiment.

Within the acid diffusion region 142 of the second mask layer 140, a protecting group of polymer included in the second mask layer 140 is de-protected by the acid diffused from only the capping films 130 or the acid diffused from both the first mask patterns 120 and the capping films 130, and thus the second mask layer 140 turns into a state soluble in a developing solution.

Although not shown in FIG. 1E, when the upper capping film (not shown) or the acid supply layer (not shown) comprises the same material as the material used to form the capping films 130 and is further formed on the upper surface of the second mask layer 140 after the formation of the second mask layer 140 as described above with reference to FIG. 1D, not only acid obtained from the acid source included in the capping films 130 but also acid obtained from the upper capping film may be diffused into the second mask layer 140 so that upper acid diffused regions (not shown) extending a predetermined depth from the upper surface of the second mask layer 140 may be formed, not only around the first mask patterns 120, but also in the upper portion of the second mask layer 140.

Figure 1F:
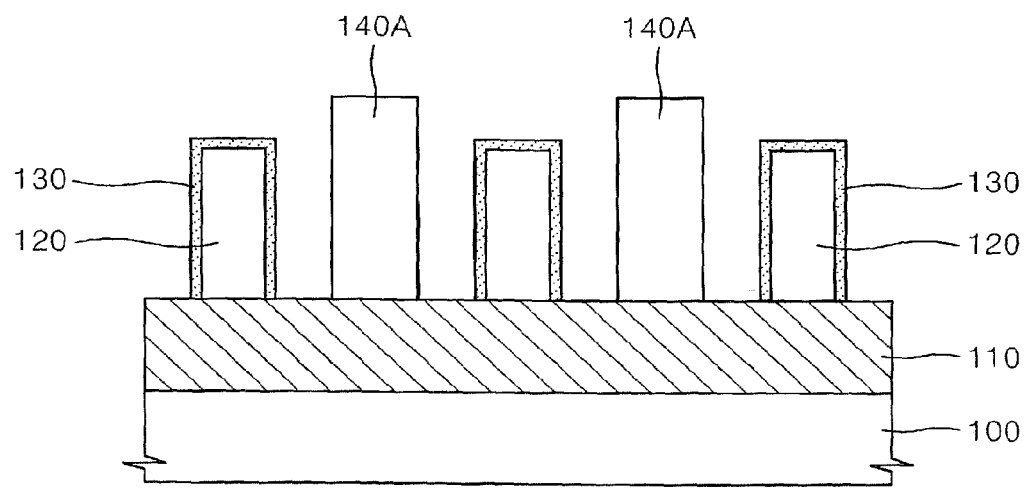

Referring to FIG. 1F, the acid diffused regions 142 of the second mask layer 140 are removed. Consequently, a plurality of second mask patterns 140A corresponding to residual portions of the second mask layer 140 may be formed within the first spaces S1.

In order to remove the acid diffused regions 142 of the second mask layer 140, a process of developing the acid diffused regions 142 may be performed. The process may include using a basic aqueous developing solution, for example, a solution of tetramethyl ammonium hydroxide (TMAH) of 2.38% by weight.

Figure 1G:
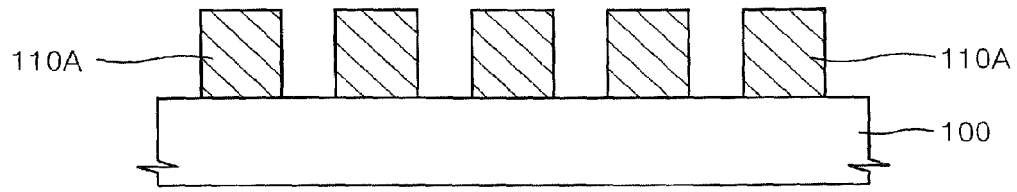

Referring to FIG. 1G, fine patterns 110A are formed by etching the to-be-etched film 110 by using the first mask patterns 120 and the second mask patterns 140A as an etch mask.

After the formation of the fine patterns 110A, portions of the first mask patterns 120 and the second mask patterns 140A remaining on the fine patterns 110A may be removed. The remaining portions of the first mask patterns 120 and the second mask patterns 140A may be removed using an ashing process and a stripping process.

FIG. 2 is a flowchart illustrating operations that can be implemented when the second mask layer 140 includes polymer having an acid-labile group and the second PAG or when the second mask layer 140 includes the polymer having an acid-labile group and includes neither the first PAG nor the second PAG, in the fine pattern forming method illustrated in FIGS. 1A through 1G, according to an embodiment of the inventive concept.

Referring to FIG. 2, in operations 210a through 210d, the first mask patterns 120, the capping films 130, and the second mask layer 140 are formed on the to-be-etched film 110 on the substrate 100 as described above with reference to FIGS. 1A through 1D. Here, the second mask layer 140 may include a polymer having an acid-labile group and the second PAG, or may include the polymer having an acid-labile group and may include neither the first PAG nor the second PAG.

Operations 210e-1 and 210e-2 correspond to the formation of the acid diffused regions 142 described above with reference to FIG. 1E. The operation 210e-1 denotes a process of generating acid from the capping films 130, and the operation 210e-2 denotes a process of diffusing the acid generated from the capping films 130.

When the acid source included in the capping films 130 is acid, for example, water-soluble acid, the acid generation process, namely, the operation 210e-1, may be omitted, and the operation 210e-2 may follow the operation 210d. When the acid source included in the capping films 130 is the first PAG, a resultant substrate on which the second mask layer 140 has been formed may be exposed to a laser as provided herein so as to generate acid from the first PAG of the capping films 130. On the other hand, when the acid source included in the capping films 130 is a TAG, a resultant substrate on which the second mask layer 140 has been formed may be thermally treated to generate acid from the TAGs of the capping films 130.

In operation 210e-2, a resultant substrate on which acid exists in the capping films 130 may be thermally treated so as to diffuse the acid existing in the capping films 130 into the second mask layer 140.

Thereafter, the fine patterns 110A are formed on the substrate 100 through the processes described above with reference to FIGS. 1F and 1G.

FIG. 3 is a flowchart illustrating operations that may be implemented when the second mask layer 140 includes a polymer having an acid-labile group and the first PAG, in the fine pattern forming method illustrated in FIGS. 1A through 1G, according to an embodiment of the inventive concept.

Referring to FIG. 3, in operations 310a through 310d, the first mask patterns 120, the capping films 130, and the second mask layer 140 are formed on the to-be-etched film 110 on the substrate 100 as described above with reference to FIGS. 1A through 1D. Here, the second mask layer 140 may include the polymer having an acid-labile group and the first PAG.

Operations 310e-1 and 310e-2 correspond to the formation of the acid diffused regions 142 described above with reference to FIG. 1E. The operation 310e-1 denotes a process of generating acid from the capping films 130, and the operation 310e-2 denotes a process of diffusing the acid generated from the capping films 130. In the present embodiment, since the second mask layer 140 includes the first PAG, exposure may not be performed after the second mask layer 140 is formed and until the second mask layer 140 is removed, in order to prevent acid from being generated from the first PAG. Thus, the capping films 130 may include no PAGs which generate acid during exposure.

In operation 310e-1, when the acid source included in the capping films 130 is acid, for example, a water-soluble acid, the acid generation process, namely, the operation 310e-1, may be omitted, and the operation 310e-2 may follow the operation 310d. When the acid source included in the capping films 130 is the TAG, a resultant substrate on which the second mask layer 140 has been formed may be thermally treated so as to generate acid from the TAGs of the capping films 130.

In operation 310e-2, a resultant substrate on which acid exists in the capping films 130 may be thermally treated so as to diffuse the acid existing in the capping films 130 into the second mask layer 140.

Thereafter, the fine patterns 110A may be formed on the substrate 100 through the processes described above with reference to FIGS. 1F and 1G.

Experiment

As described above with reference to FIG. 1E, if the second mask layer 140 includes an acid source composed of the second PAG not including a chromophore group, when the acid was diffused from the capping films 130 into the second mask layer 140, the second PAG adjacent to the acid may diffuse into the second mask layer 140 acted as acid without undergoing exposure.

First, an ArF resist layer including acid-labile polymer and a second PAG composed of trimethylsulfonium triflate was formed on a silicon wafer, and a first sample group which formed a $C_4F_9SO_3H$ acid source layer on the resist layer was manufactured. The first sample group includes first samples respectively including 1% by weight of the second PAG and and 5.0% by weight of the second PAG based on the gross weight of the polymer within the resist layer.

As a comparative, a second sample was manufactured in the same manner as that of the first sample group except that an ArF resist layer not including the second PAG was formed.

The first sample group and the second sample were thermally treated for 60 seconds at 100° C. so as to diffuse acid from the acid source layer to the resist layer.

When the first sample group and the second sample had not undergone exposure, the first sample group and the second sample were developed using a solution of TMAH of 2.38% by weight, and then the amount of the resist layer removed was measured. As a result, the thicknesses of the resist layers of the first samples removed due to the developing of the resist layers of the first samples, including 1% and 5.0% by weight of the second PAGs based on the gross weight of the polymer, were about 280 Å and about 667 Å, respectively. In other words, as the amount of the second PAG contained in the resist layer of the first sample group increases, the amount of the resist layer removed due to the development increases. Meanwhile, the thickness of the resist layer of the second sample removed due to the developing of the resist layer of the second sample was about 249 Å.

When the first sample group and the second sample had not undergone exposure, distances by which the acid from the acid source layer was diffused up to the resist layers of the first samples, including 1% and 5.0% by weight of the second PAGs based on the gross weight of the polymer, were about 270 Å and about 659 Å, respectively. Meanwhile, a distance by which the acid from the acid source layer was diffused to the resist layer of the second sample was about 248 Å.

According to the results of the aforementioned experiment, in the case of the first sample group, a portion of the second PAG contained in the resist layer, which is adjacent to the acid diffused from the acid source layer, from among the entire second PAG acts as acid even without execution of exposure, and thus deprotects the protecting group of the polymer contained in the resist layer.

Thus, in the embodiment described above with reference to FIGS. 1A through 1G, when the second PAG is included in the second mask layer 140, the size of the acid diffused regions 142 may be enlarged compared with when second PAGs are not included in the second mask layer 140.

According to the present invention, in a method of forming fine-pitch patterns, which are required to manufacture highly-integrated semiconductor devices, by using a double patterning process, first, a plurality of first mask patterns are formed on a substrate, a capping film including an acid source is formed on exposed surfaces of each of the first mask patterns, and a second mask pattern may then be formed in between every two adjacent first mask patterns by diffusion of acid from the capping films. In this way, the fine-pitch patterns, which overcome a resolution limit generated during photolithography, may be formed.

Furthermore, the density of patterns may be increased by using a method of arranging a mask pattern in between every two adjacent first mask patterns according to acid diffusion. Thus, patterns having fine widths that are not controlled by a typical process may be formed, the density of patterns required to manufacture a semiconductor device can be increased, and various forms of fine patterns can be formed. Therefore, patterns having a fine pitch difficult to achieve in a typical photolithographic process may be easily formed.

While the present invention has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of forming fine patterns of a semiconductor device, the method comprising:
   forming a plurality of first mask patterns on a substrate;
   forming a capping film on exposed surface areas of each of the plurality of first mask patterns, wherein the capping film comprises an acid source comprising one of acid, a first photoacid generator having a chromophore group, and a thermoacid generator;
   forming a second mask layer on the capping film, wherein the second mask layer comprises polymer having an acid-labile group and a second photoacid generator not having a chromophore group;
   forming a plurality of acid diffused regions within the second mask layer by diffusing acid obtained from the acid source from the capping film into the second mask layer;
   removing the acid diffused regions of the second mask layer; and
   forming a plurality of second mask patterns corresponding to residual parts of the second mask layer which remain after removing the acid diffused regions of the second mask layer.

2. The method of claim 1, wherein:
   the capping film on exposed surfaces of each of the plurality of first mask patterns comprises the first photoacid generator as the acid source; and
   the forming of the acid diffused regions comprises:
      generating a first acid from the first photoacid generator contained in the capping film by exposing the resultant substrate on which the second mask layer has been formed on the capping film; and
      diffusing the first acid from the capping film into the second mask layer by thermally treating a resultant substrate on which the first acid has been generated.

3. The method of claim 1, wherein:
   the capping film on exposed surfaces of each of the plurality of first mask patterns comprises a thermoacid generator as the acid source; and
   the forming of the acid diffused regions comprises:
      generating a second acid from the thermoacid generator contained in the capping film by thermally treating the resultant substrate on which the second mask layer has been formed on the capping film; and
      diffusing the second acid from the capping film into the second mask layer.

4. The method of claim 1, wherein the acid diffused regions are developed using a basic aqueous solution in order to be removed from the second mask layer.

5. A method of forming fine patterns of a semiconductor device, the method comprising:
   forming a plurality of first mask patterns on a substrate;
   forming a capping film on exposed surface areas of each of the plurality of first mask patterns, wherein the capping film comprises an acid source comprising one of acid, a first photoacid generator having a chromophore group, and a thermoacid generator;
   forming a second mask layer on the capping film on exposed surfaces of each of the plurality of first mask patterns, wherein the second mask layer comprises polymer having an acid-labile group and comprises neither acid nor potential acid;
   forming a plurality of acid diffused regions within the second mask layer by diffusing acid obtained from the acid source from the capping film into the second mask layer;
   removing the acid diffused regions of the second mask layer; and
   forming a plurality of second mask patterns corresponding to residual parts of the second mask layer which remain after removing the acid diffused regions of the second mask layer.

6. The method of claim 5, wherein, in the forming of the acid diffused regions, a resultant substrate on which the second mask layer has been formed is thermally treated so as to diffuse the acid obtained from the acid source from the capping film into the second mask layer.

7. The method of claim 5, wherein:
   the capping film on exposed surfaces of each of the plurality of first mask patterns comprises the first photoacid generator as the acid source; and
   the forming of the acid diffused regions comprises:
      generating a first acid from the first photoacid generator contained in the capping film by exposing the resultant substrate on which the second mask layer has been formed on the capping film; and
      diffusing the first acid from the capping film into the second mask layer by thermally treating a resultant substrate on which the first acid has been generated.

8. The method of claim 5, wherein:
   the capping film on exposed surfaces of each of the plurality of first mask patterns comprises a thermoacid generator as the acid source; and
   the forming of the acid diffused regions comprises:
      generating a second acid from the thermoacid generator contained in the capping film by thermally treating the resultant substrate on which the second mask layer has been formed on the capping film; and
      diffusing the second acid from the capping film into the second mask layer.

9. The method of claim 5, wherein:
   the plurality of first mask patterns comprise a photoresist film; and
   between the forming of the plurality of first mask patterns and the forming of the second mask layer, the method further comprises hardening the plurality of first mask patterns so that the plurality of first mask patterns have insolubility with respect to an organic solvent.

10. A method of forming fine patterns of a semiconductor device, the method comprising:
    forming a plurality of first mask patterns on a substrate;
    forming a capping film on exposed surface areas of each of the plurality of first mask patterns, wherein the capping film comprises an acid source comprising one of acid and a thermoacid generator;
    forming a second mask layer on the capping film, wherein the second mask layer comprises a polymer having an acid-labile group and a first photoacid generator having a chromophore group;

forming a plurality of acid diffused regions within the second mask layer by diffusing acid obtained from the acid source from the capping film into the second mask layer;

removing the acid diffused regions of the second mask layer; and forming a plurality of second mask patterns corresponding to residual parts of the second mask layer which remain after removing the acid diffused regions of the second mask layer.

* * * * *